United States Patent
So et al.

(10) Patent No.: US 11,804,389 B2
(45) Date of Patent: Oct. 31, 2023

(54) ANNEALING APPARATUS

(71) Applicant: Samsung Display Co., Ltd., Yongin-si (KR)

(72) Inventors: Byung Soo So, Yongin-si (KR); In Cheol Ko, Hwaseong-si (KR); Jong Jun Baek, Seoul (KR); Jae Woo Jeong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 583 days.

(21) Appl. No.: 16/535,021

(22) Filed: Aug. 7, 2019

(65) Prior Publication Data

US 2020/0051835 A1 Feb. 13, 2020

(30) Foreign Application Priority Data

Aug. 9, 2018 (KR) .................. 10-2018-0093047

(51) Int. Cl.
| | |
|---|---|
| *H01L 21/67* | (2006.01) |
| *H05B 6/80* | (2006.01) |
| *H01L 29/786* | (2006.01) |
| *H01L 27/12* | (2006.01) |

(52) U.S. Cl.
CPC .......... *H01L 21/67115* (2013.01); *H05B 6/80* (2013.01); *H01L 27/124* (2013.01); *H01L 27/1222* (2013.01); *H01L 29/78672* (2013.01)

(58) Field of Classification Search
CPC .......... H01L 21/67115; H01L 27/1222; H01L 27/124; H01L 29/78672; Y10S 257/921; H05B 6/80

USPC ......................................................... 219/759
See application file for complete search history.

(56) References Cited

U.S. PATENT DOCUMENTS

| | | | | |
|---|---|---|---|---|
| 5,487,875 | A * | 1/1996 | Suzuki .............. | H01J 37/32229 422/186.05 |
| 9,018,110 | B2 * | 4/2015 | Stowell .................. | H05B 6/702 438/795 |
| 10,475,652 | B2 | 11/2019 | Yamaguchi et al. | |
| 2007/0167029 | A1 | 7/2007 | Kowalski et al. | |

(Continued)

FOREIGN PATENT DOCUMENTS

| | | |
|---|---|---|
| JP | 2004165374 | 6/2004 |
| KR | 10-2007-0021724 | 2/2007 |

(Continued)

OTHER PUBLICATIONS

Boston University, Diffraction from a single slit, Physics department (Year: 2014).*

(Continued)

*Primary Examiner* — Nathaniel E Wiehe
*Assistant Examiner* — Spencer H. Kirkwood
(74) *Attorney, Agent, or Firm* — H.C. Park & Associates, PLC

(57) ABSTRACT

An annealing apparatus includes: a main body configured to receive a substrate; a microwave generating unit configured to generate microwaves to be transmitted to the main body; an incidence unit configured to transmit the microwaves from the microwave generating unit to the main body; and a diffraction unit disposed between the incident unit and the main body. The diffraction unit is configured to pass the microwaves therethrough before they are transmitted to the main body.

11 Claims, 9 Drawing Sheets

(56) References Cited

U.S. PATENT DOCUMENTS

| | | | | |
|---|---|---|---|---|
| 2011/0117202 A1* | 5/2011 | Bourke, Jr. | ............. | A61N 1/44 |
| | | | | 424/490 |
| 2017/0165631 A1* | 6/2017 | Takatani | ............... | B01J 19/126 |
| 2019/0378731 A1* | 12/2019 | Yanagisawa | ...... | H01L 21/67309 |

FOREIGN PATENT DOCUMENTS

| | | |
|---|---|---|
| KR | 10-2008-0080113 | 9/2008 |
| KR | 10-2017-0098996 | 8/2017 |
| KR | 10-2017-0120526 | 10/2017 |
| KR | 20180010250 | 1/2018 |
| WO | 2007-059027 | 5/2007 |

OTHER PUBLICATIONS

Huygens-Fresnel principle, available at https://en.wikipedia.org/wiki/Huygens%E2%80%93Fresnil_principle (last edited on Jul. 19, 2019).

\* cited by examiner

ANNEALING APPARATUS

CROSS-REFERENCE TO RELATED APPLICATION

This application claims priority from and the benefit of Korean Patent Application No. 10-2018-0093047, filed on Aug. 9, 2018, which is hereby incorporated by reference for all purposes as if fully set forth herein.

BACKGROUND

Field

Exemplary implementations of the invention relate generally to an annealing apparatus and, more specifically, to an apparatus for providing heat onto substrates using a microwave.

Discussion of the Background

A heat treatment process such as an annealing is conventionally performed to manufacture an element including a semiconductor. By improving a characteristic of the element through the heat treatment process, an effect that a characteristic of the semiconductor element may be improved.

The heat treatment processes conventionally include a method providing heat by directly using a heater and a method providing heat through microwaves.

When microwaves are used, as the size of the display device increases, it is difficult to uniformly provide the microwaves, and the heat treatment using the microwaves cannot be effectively performed.

The above information disclosed in this Background section is only for understanding of the background of the inventive concepts, and, therefore, it may contain information that does not constitute prior art.

SUMMARY

Devices constructed according to exemplary implementations of the invention are capable of providing an annealing apparatus capable of uniformly performing heat treatment using microwaves.

Additional features of the inventive concepts will be set forth in the description which follows, and in part will be apparent from the description, or may be learned by practice of the inventive concepts.

According to one or more implementations/embodiments of the invention, an annealing apparatus includes: a main body configured to receive a substrate; a microwave generating unit configured to generate microwaves to be transmitted to the main body; an incidence unit configured to transmit the microwaves from the microwave generating unit to the main body; and a diffraction unit disposed between the incident unit and the main body, the diffraction unit configured to pass the microwaves therethrough before they are transmitted to the main body.

The diffraction unit may include a plurality of slits to diffract the microwaves.

Each of the plurality of slits may have a width of 180 mm or greater and 220 mm or less and a height of 45 mm or greater and 55 mm or less.

The incidence unit may include an opening of which a width widens in a direction extending from the microwaves generating unit toward the diffraction unit.

The incidence unit may include a first opening adjoining the microwave generating unit has a height of 270 mm or greater and 330 mm or less and a width of 405 mm or greater and 495 mm or less.

The incidence unit may include a second opening adjoining the diffraction unit has a height of 450 mm or greater and 550 mm or less and a width of 630 mm or greater and to 770 mm or less.

The main body may include a diffusive reflection structure formed on an inner surface of the main body.

The diffusive reflection structure may have a structure including protrusions and depressions.

The protrusions and depressions structure may have a pitch value of 54 mm or greater and 66 mm or less.

The diffusive reflection structure may include silver (Ag) coated on the surface of the diffusive reflection structure.

The main body and the incidence unit may be formed of a stainless steel (SUS) material.

The main body and the incidence unit may include silver (Ag) coated on an inner surface of the SUS material.

The diffraction unit may be formed of the SUS material.

An inner surface of the main body and the incidence unit may include silver (Ag) coated on the inner surface of the main body and the incidence unit.

The microwave generating unit may include a magnetron.

The microwave generating unit may be configured to generate two sets of microwaves having different frequencies.

The two sets of microwaves may have frequencies of 5.8 GHz and 2.45 GHz, respectively.

The wavelength of the two sets of microwaves may be 50 mm and 120 mm, respectively.

The main body may be configured to receive a plurality of substrates, and the substrate may be a mother substrate for display panel for the display device.

The substrate may include wiring including aluminum formed on the substrate, and the annealing apparatus may be configured to heat treat the substrate without forming hillocks on a surface of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
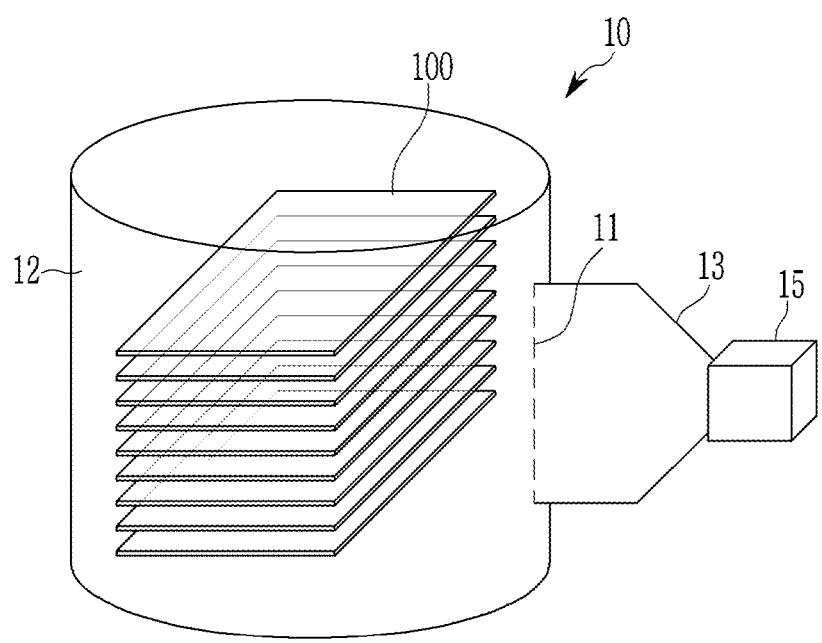
FIG. 1 is a schematic perspective view of an annealing apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

An annealing apparatus according to an exemplary embodiment of the present invention is described with reference to FIGS. 1, 2, 3, and 4.

First, an overall annealing apparatus is described with reference to FIG. 1.

FIG. 1 is a schematic perspective view of an annealing apparatus according to an exemplary embodiment.

The annealing apparatus 10 according to an exemplary embodiment includes a main body (or a chamber) 12, a microwave generating unit 15, an incidence unit 13, and a diffraction unit 11.

The main body 12 provides a space receiving a substrate 100 during performing a heat treatment or annealing, and the diffraction unit 11 and the incidence unit 13 are disposed on one side surface thereof so that the microwaves may be uniformly transmitted to the substrate 100. The substrate 100 received in the main body 12 may be plural, and may be a mother substrate of the display device having a large size.

Figure 4:
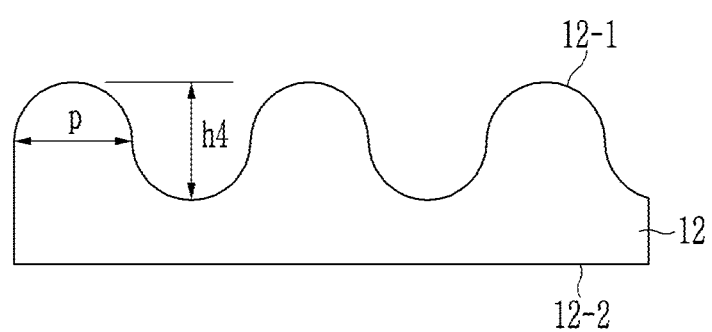
FIG. 4 is a cross-sectional view of a diffusive reflection structure disposed on an inner surface of an annealing apparatus according to an exemplary embodiment.

The main body 12 may include a stainless steel (SUS) material, and may additionally include silver (Ag) coated on the inner surface thereof. The SUS material has a characteristic that the microwaves are reflected well therefrom, but if silver (Ag) is coated thereon, the reflection characteristic of the microwaves may be further improved. Also, according to an exemplary embodiment, the main body 12 may include various materials with the silver (Ag) coated on the inside thereof. As shown in FIG. 4, a diffusive reflection structure diffusing the microwaves may be formed on the inner surface of the main body 12.

A partial side surface of the main body 12 may be opened so that the diffraction unit 11 and the incidence unit 13 are connected therewith.

The incidence unit 13 is directly connected to the opening of the main body 12 and is configured to be a waveguide pipe and transmit the microwaves to the main body 12. The material configuring the incidence unit 13 may also be formed of the stainless steel (SUS) material like the main body 12, and silver (Ag) may be coated on the inside surface thereof. Also, according to an exemplary embodiment, the incidence unit 13 may include various materials with the silver (Ag) coated on the inside thereof. The microwave generating unit 15 is disposed on the other end of the incidence unit 13.

According to an exemplary embodiment, the incidence unit 13 may be disposed at another position of the main body 12, such as an upper surface that is not the side surface. Also, according to an exemplary embodiment, a plurality of incidence units 13 may be formed to provide the microwaves at various positions of the main body 12. In this case, a plurality of microwave generating units 15 may be provided, corresponding to the number of incidence units 13.

The microwave generating unit 15 may include a magnetron as a microwave generation apparatus. According to the present exemplary embodiment, the microwave generating unit 15 includes a dual magnetron to generate two sets of microwaves having different frequencies. The frequencies of the two sets of microwaves generated in the present exemplary embodiment may be about 5.8 GHz and 2.45 GHz, respectively. The wavelength of the microwaves may be about 50 mm and 120 mm.

The microwaves emitted from the microwave generating unit 15 may include the other frequencies as above-described, and the number of microwaves using the other frequencies may be one, or three or more.

The microwaves emitted from the microwave generating unit 15 pass through the incidence unit 13 having the waveguide pipe structure and are transmitted to the main body 12, and in detail, are transmitted into the main body 12 after passing through the diffraction unit 11.

The diffraction unit 11 may be disposed in the incidence unit 13, or may be disposed at the boundary of the main body 12 and the incidence unit 13. In the exemplary embodiment of FIG. 1, the diffraction unit 11 is disposed on the boundary of the incidence unit 13 and the main body 12.

The structure of the diffraction unit 11 will now be described in detail with reference to FIG. 2.

Figure 2:
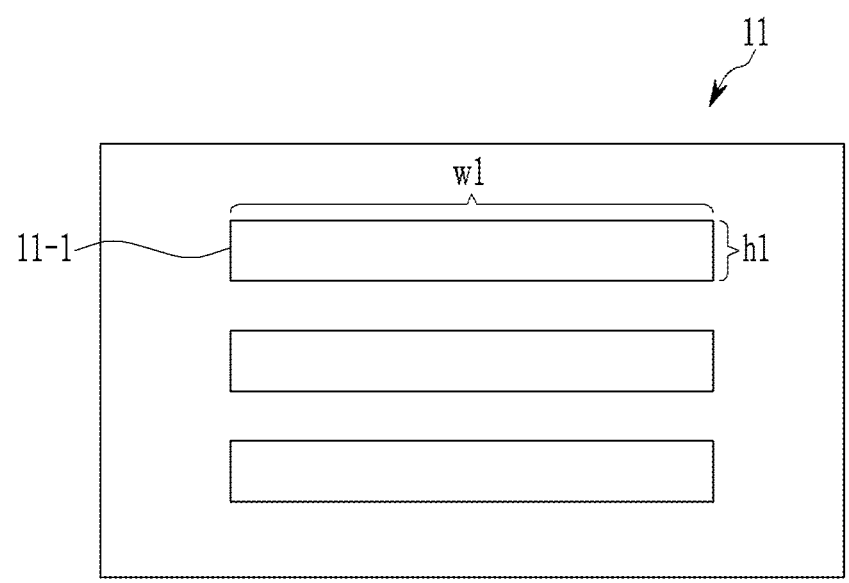
FIG. 2 is a plan view of a diffraction unit viewed from a first direction according to an exemplary embodiment.

FIG. 2 is a plan view of a diffraction unit viewed from a first direction according to an exemplary embodiment. The first direction may correspond to the direction that the microwaves are transmitted from the microwave generating unit 15 through the incidence unit 13 towards the diffraction unit 11.

The diffraction unit 11 has a structure in which a plurality of slits 11-1 that are opened on a flat surface is formed. FIG. 2 shows three slits 11-1, and in contrast, more slits 11-1 may be formed.

Each slit 11-1 according to the present exemplary embodiment has a width w1 of 200 mm and a height h1 of 60 mm. Since the wavelength of the microwaves is about 50 mm, the slit is formed having the height h1 that is slightly larger than the wavelength. As a result, an effect (diffraction) that the microwaves are spread while passing through the slit 11-1 is largely generated. According to an exemplary embodiment, the slit 11-1 may have a width w1 of 180 mm to 220 mm and a height h1 of 45 mm to 55 mm.

The part except for the slit 11-1 among the diffraction unit 11 may be formed of the same material as the incidence unit 13.

Next, a structure in which the incidence unit 13 and the diffraction unit 11 are viewed from the side where the microwave generating unit 15 is disposed is described with reference to FIG. 3.

Figure 3:
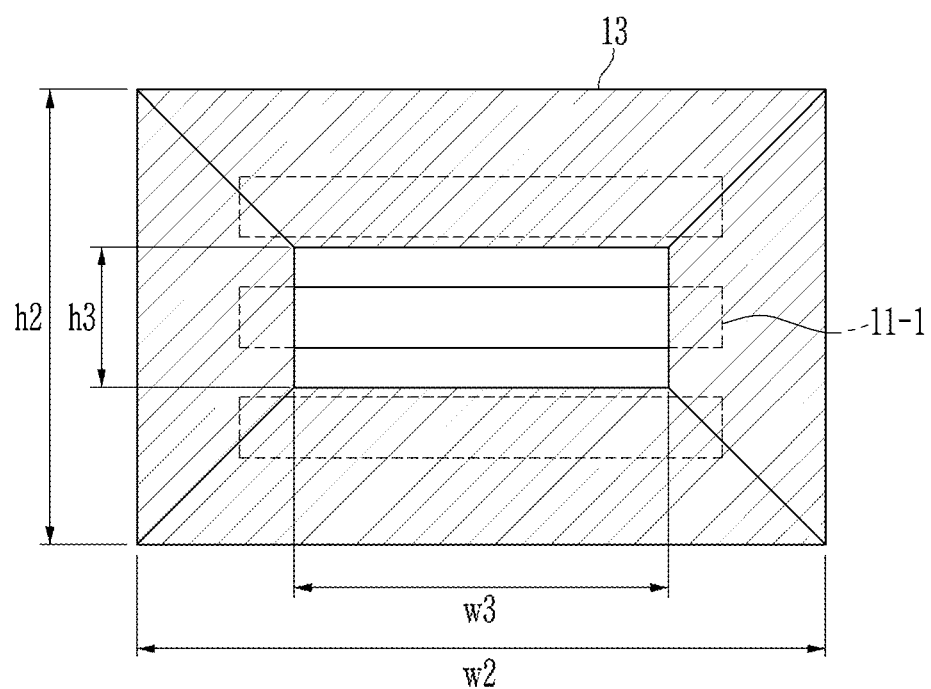
FIG. 3 is a plan view of an incidence unit and a diffraction unit of an annealing apparatus viewed from the first direction according to an exemplary embodiment.

FIG. 3 is a plan view of an incidence unit and a diffraction unit of an annealing apparatus viewed from the first direction according to an exemplary embodiment.

FIG. 3 is a view of the incidence unit 13 and the diffraction unit 11 in the direction that the microwaves are transmitted on the side where the microwave generating unit 15 is disposed.

The diffraction unit 11 is disposed downward, and referring to FIG. 1, four side surfaces of the incidence unit 13 consist of the surfaces extending obliquely while extending in the vertical direction from each edge of the diffraction unit 11 and bending inside. The incidence unit 13 includes a part of which the width is gradually widened from the microwave generating unit 15 toward the diffraction unit 11.

Referring to the plan view of FIG. 3, some of the slits 11-1 among the diffraction unit 11 are overlapped by the side surface of the incidence unit 13 in the first direction and are not shown, and only a part of one slit is shown. The not-shown slits 11-1 are indicated by dotted lines in FIG. 3.

A size of a cross-sectional size of the opening of the incidence unit 13 may be the greatest at a part where the diffraction unit 11 is disposed, and the smallest at a part where the microwave generating unit 15 is disposed. The part of the incidence unit 13 having the greatest cross-sectional opening has sides of a height h2 of 500 mm and a width w2 of 700 mm. According to an exemplary embodiment, the height h2 may be 450 mm or greater and 550 mm or less, and the width w2 may be 630 mm or greater and 770 mm or less. The part of the incidence unit 13 having the smallest cross-sectional opening has sides of a height h3 of 300 mm and a width w3 of 450 mm. According to an exemplary embodiment, the height h3 may be 270 mm or great and 330 mm or less, and the width w3 may be 405 mm or greater and 495 mm or less.

According to FIG. 3, an example of the diffraction unit 11 includes three slits 11-1, the height of each of the slit 11-1 being 50 mm. The arrangement and the number of slits 11-1 may be formed with an appropriate interval so that the diffraction characteristic is uniform.

Sufficiently uniform microwaves may be provided to the substrate 100 by the above-described annealing apparatus according to an exemplary embodiment. However, to provide more uniform microwaves, as shown in FIG. 4, the diffusive reflection structure may be formed on the inner surface of the annealing apparatus 10.

FIG. 4 is a cross-sectional view of a diffusive reflection structure disposed on an inner surface of an annealing apparatus according to an exemplary embodiment.

FIG. 4 is an enlarged cross-sectional view of a part among the main body 12 of the annealing apparatus 10.

An inner surface 12-1 of the main body 12 of the annealing apparatus 10 is formed of a structure of rough surface including protrusions and depressions as shown in FIG. 4, so that the microwave diffraction is generated such that the microwaves are uniformly provided to the substrate 100.

In FIG. 4, an outer surface 12-2 and the inner surface 12-1 are disposed on the main body 12 of the annealing apparatus 10, whereby the rough diffusive reflection structure is formed on the inner surface 12-1. Although not shown in FIG. 4, silver (Ag) may be coated along the rough surface including protrusions and depressions on the inner surface 12-1.

The diffusive reflection structure according to an exemplary embodiment has the pitch p of 60 mm and the height h4 of 60 mm corresponding to the wavelength of the microwaves. That is, since the wavelength of the microwaves is 50 mm, the diffusive reflection often occurs by forming the protrusions and depressions structure to be slightly larger than the wavelength. According to an exemplary embodiment, the pitch p and the height h4 of the diffusive reflection structure may be formed at 54 mm or greater and 66 mm or less.

Next, an effect according to the present exemplary embodiment is described with reference to FIGS. 5, 6, 7, 8, and 9.

Figure 5:
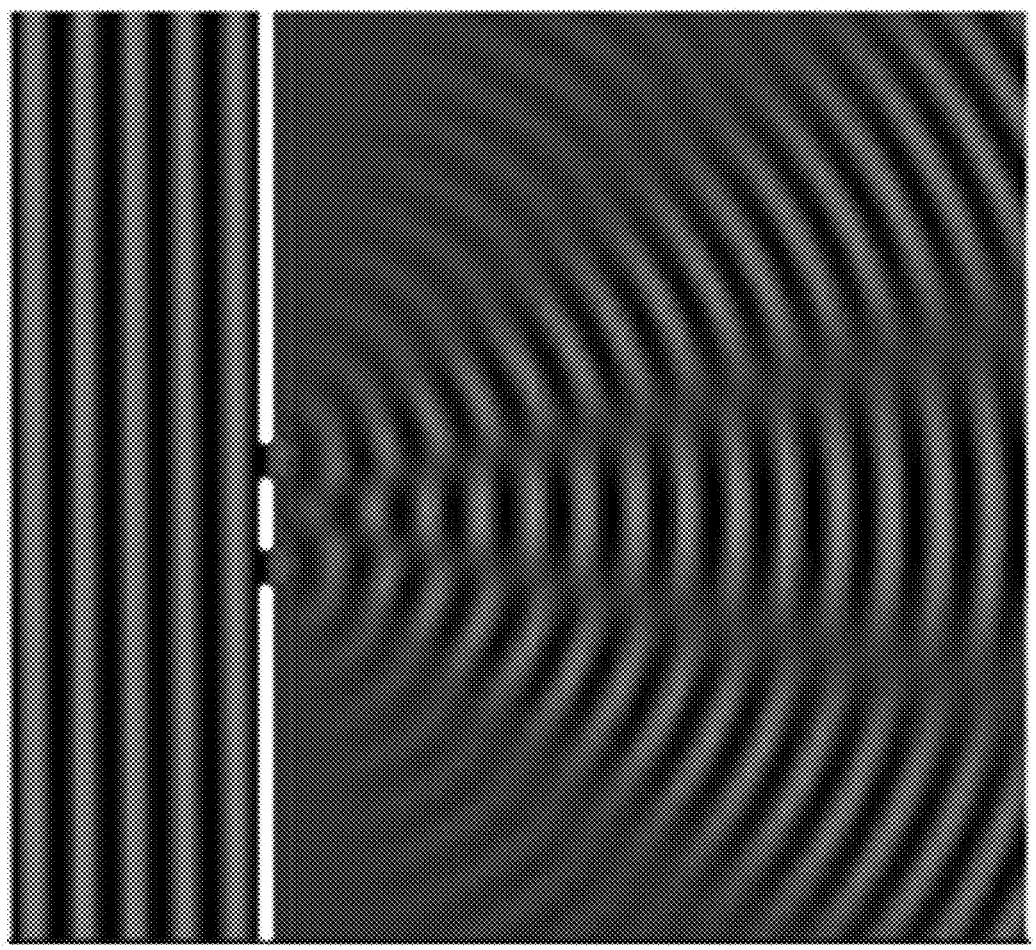
FIG. 5 is a view showing an optical characteristic of a diffraction unit according to an exemplary embodiment.

FIG. 5 is a view showing an optical characteristic of a diffraction unit according to an exemplary embodiment.

FIG. 5 shows a characteristic that the light is progressed by the diffraction. That is, the microwaves passing through the diffraction unit 11 enter the main body 12 while having a characteristic that the light is spread, and as a result, the microwaves are uniformly spread to the entire main body 12. The evenly spread microwaves reach the substrate 100 such that an effect of uniformly heating the entire region of the substrate 100 appears.

The diffracted light may undergo constructive interference or destructive interference at some positions. That is, the heat treatment effect due to the microwaves may be manifested differently between a position where the constructive interference occurs and a position where the destructive interference occurs. However, since the inner surface of the main body 12 is also formed of the material from which the microwaves are reflected and the reflected microwaves are also provided to the substrate 100, the constructive interference and the destructive interference may be reduced and the microwaves applied onto the substrate 100 may have improved uniformity.

Also, the heat treatment difference in the constructive interference and the destructive interference may be substantially reduced if the substrate is small.

When the size of the substrate is increased, since the difference of the heat treatment effect depending on the positions may be increased compared with the small substrate, according to an exemplary embodiment, the diffusive reflection structure such as the protrusions and depressions structure further formed on the inner surface of the main body 12 may improve the uniformity of the microwave applied onto the substrate.

Figure 6:
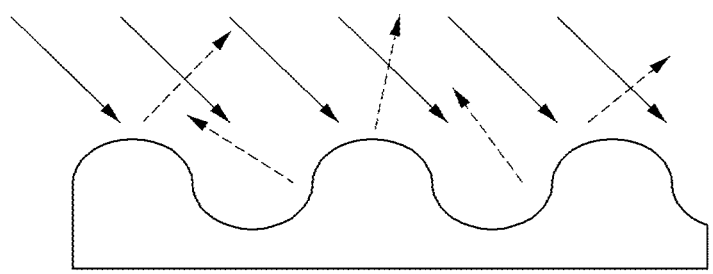
FIG. 6 is a view showing an optical characteristic of a diffusive reflection structure according to an exemplary embodiment.

The reflection characteristic of the microwaves by the diffusive reflection structure is shown in FIG. 6.

FIG. 6 is a view showing an optical characteristic of a diffusive reflection structure according to an exemplary embodiment.

In FIG. 6, solid lines indicate the incident microwaves, and dotted lines indicate the reflected microwaves.

As shown in FIG. 6, since the microwaves are reflected at different angles in the protrusions and depressions structure, the microwaves in the main body 12 are transmitted in various directions and to various positions. Compared to a case that only includes the diffraction unit 11, the annealing apparatus 10 including the diffusive reflection structure may reflect and provide the microwaves to the positions where the constructive interference and the destructive interference may be formed, thereby improving the uniformity of the heat treatment.

In the above description, the theoretical results were examined through FIG. 5 and FIG. 6.

Next, detailed results are described with reference to FIGS. 7, 8, and 9 by comparing the exemplary embodiments with a comparative example.

Figure 7:
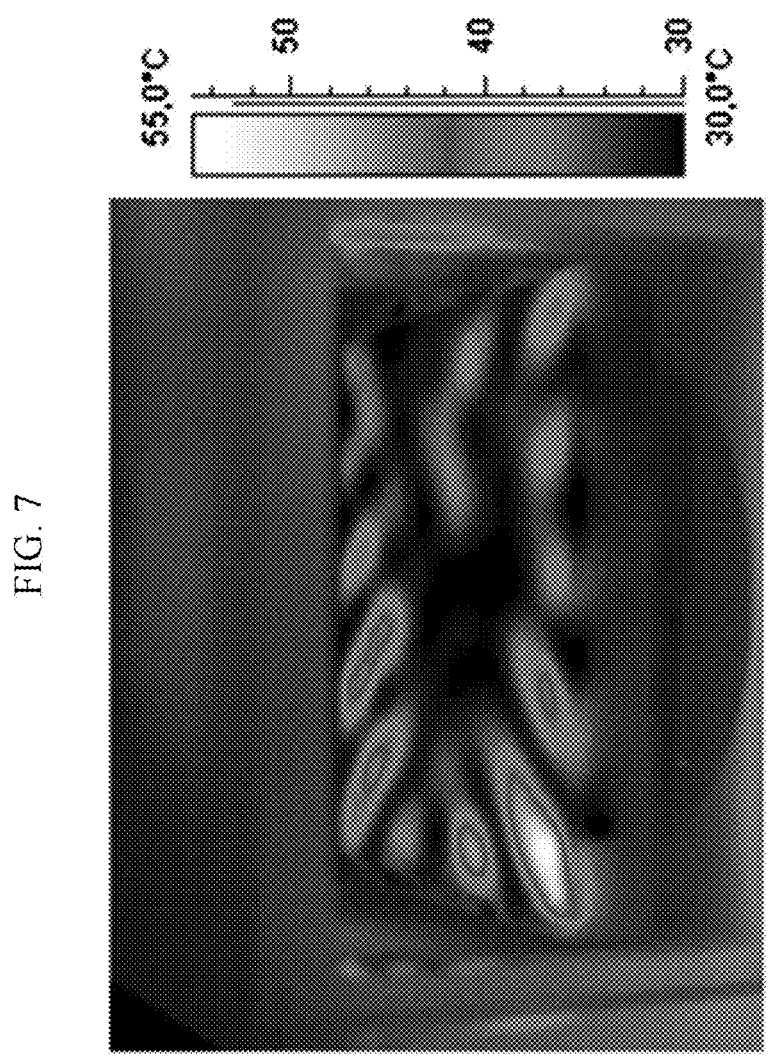
FIG. 7 shows a result of a heat treatment according to a comparative example.

FIG. 7 shows a result of a heat treatment according to a comparative example.

FIG. 7 shows the difference of the heat treatment depending on the positions on the substrate 100 when providing the microwaves without the diffraction unit 11 and the diffusive reflection structure.

FIG. 7 is a picture of a temperature distribution on the substrate that is heat treated by increasing the temperature using the microwave without the diffraction unit 11 and the diffusive reflection structure. According to FIG. 7, the comparative example shows great temperature difference depending on the positions on the substrate.

In general, when executing the heat treatment using the microwaves, as shown in FIG. 7, the heat may not be uniformly applied depending on each position, and to achieve uniform application of the heat treatment, the substrate may be rotated to distribute the microwaves, which is applied differently to different positions, on to the substrate with improved uniformity. Such a method may be seen in a microwave oven etc. Also, when wafer having a small size is used as the substrate, it is easy to rotate the wafer, and the substrate may be rotated to increase the uniformity of the provided microwaves.

However, in the case that the size of the display device increases, the size of the mother substrate including multiple wafers for the display devices may be too large to practically rotate the substrate. For reference, a wafer may have a diameter of about 6 inches and the mother substrate may have a size of one side being about three meters, and therefore, the size difference may be over 10 times.

According to the exemplary embodiments, the annealing apparatus 10 includes the diffraction unit 11 and the diffusive reflection structure, and the microwaves may be uniformly provided without rotating the mother substrate.

According to another comparative embodiment, a furnace maybe used to directly provide the heat for the heat treatment in the substrate used in the display device, instead of the microwaves to address the above-described problem. However, using the furnace for the heat treatment may cause a hillock, in which the surface of the substrate is inflated due to a high temperature.

A wiring material used for the large substrate such as the display device may include aluminum (Al), molybdenum (Mo), etc. However, using the furnace to provide the heat treatment to the substrate including the wiring material of aluminum (Al) may generate the hillock, and therefore, it may not be practical to use the aluminum (Al) as the wiring material in the heat treatment using the furnace. On the other hand, the hillock is not generated for molybdenum (Mo) from providing the heat treatment using the furnace, and the wiring material may include molybdenum (Mo) in the heat treatment using the furnace. However, molybdenum (Mo) has higher electrical resistivity compared with aluminum (Al), and may have a drawback in a voltage drop.

The annealing apparatus according to the present exemplary embodiment is used to perform experiments to determine whether the hillock is generated using the wiring material including aluminum (Al), and results are described with reference to FIG. 8.

Figure 8:
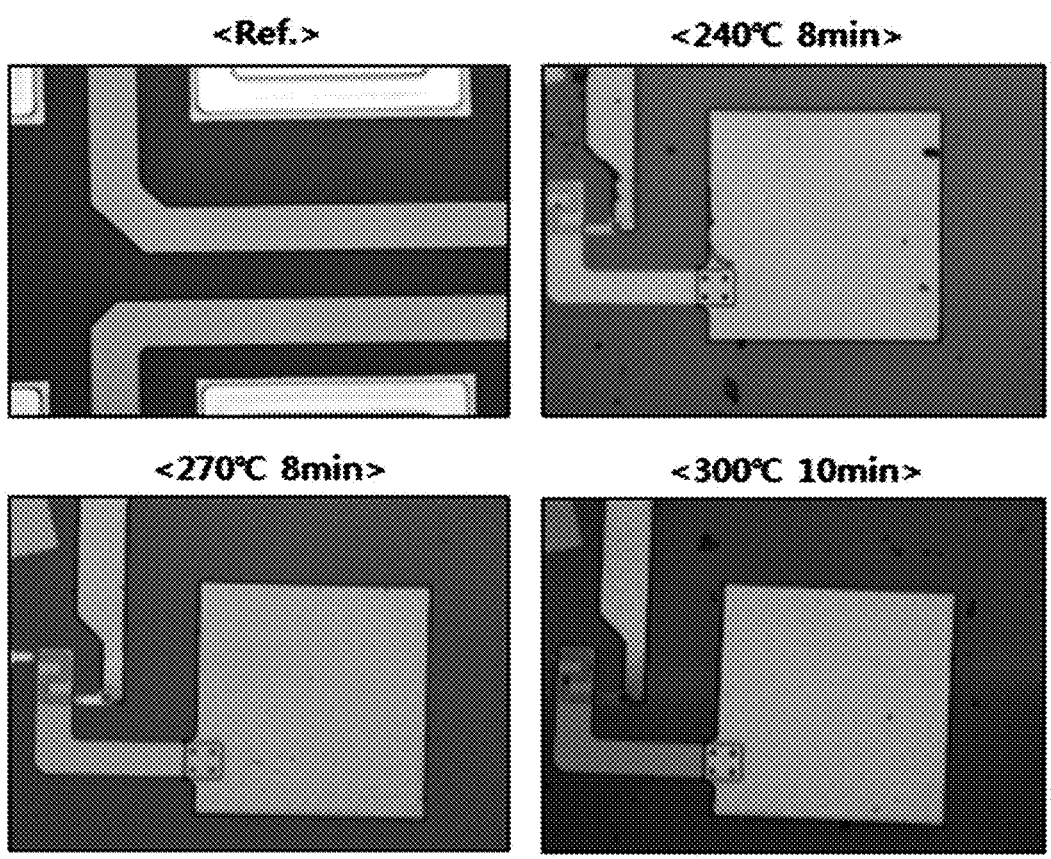
FIG. 8 shows a result of a heat treatment according to an exemplary embodiment.

FIG. 8 shows a result of heat treatment according to an exemplary embodiment.

FIG. 8 is a picture of the wiring including aluminum (Al) after the heat treatment, and Ref is a comparative picture added as a control group. According to the present exemplary embodiment, the heat treatment was executed for a time and a temperature of at 240° C. for 8 minutes, at 270° C. for 8 minutes, and at 300° C. for 10 minutes.

Referring to FIG. 8, even when the heat treatment is executed at the highest temperature of 300° C. and for the longest time of 10 minutes, the surface of the wiring including aluminum (Al) is not inflated and such problems do not occur.

Therefore, the annealing apparatus according to the present exemplary embodiment may include aluminum (Al) as the wiring material, which is conventionally difficult to use as the wiring material, compared to molybdenum (Mo).

Next, a sheet resistance (Rs) characteristic of a polycrystalline semiconductor of a semiconductor material used in the display device is described with reference to FIG. 9.

Figure 9:
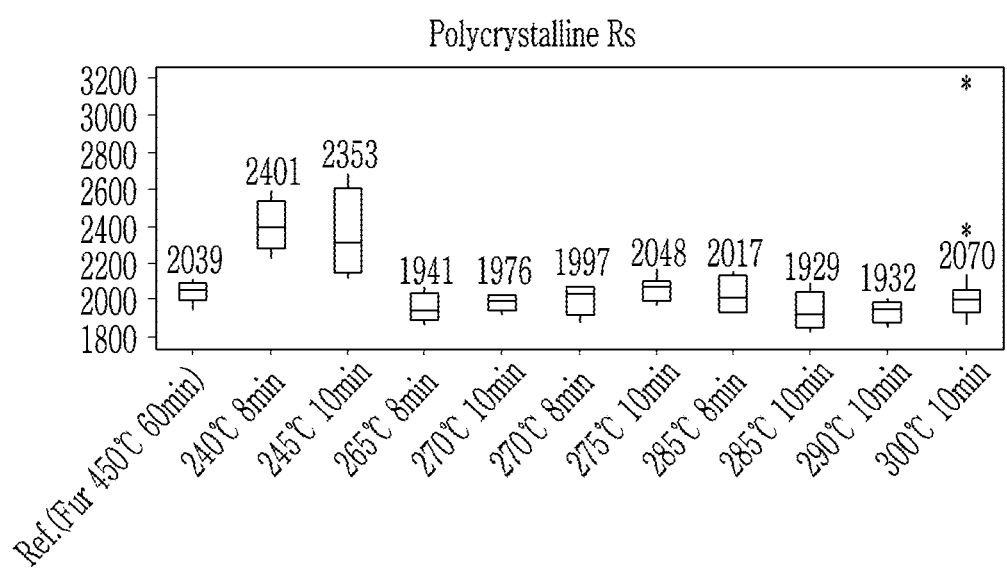
FIG. 9 is a graph showing a sheet resistance Rs characteristic depending on a heat treatment according to an exemplary embodiment.

FIG. 9 is a graph showing a sheet resistance Rs characteristic depending on a heat treatment according to an exemplary embodiment.

In the graph of FIG. 9, an x axis represents the temperature and the time for the heat treatment, and a y axis represents a sheet resistance value (unit: Ω/sq). In the x axis, Ref is the case using the furnace, and rest of the cases are the heat treatment is executed by using the annealing apparatus according to the present exemplary embodiment including the diffraction unit 11 and the diffusive reflection structure. Also, the polycrystalline semiconductor used in the experiment is a polycrystalline semiconductor doped with a p-type impurity. When the polycrystalline semiconductor is initially doped with the impurity, the doping ions are arrayed randomly and the characteristic of the element is bad. To improve the characteristic of the element, the annealing process including the heat treatment may be executed. Using the microwaves may have a merit of selectively reacting only with the doped polycrystalline semiconductor. If the annealing is performed, the randomly arranged doping ions may be rearranged uniformly such that the characteristic of the element is improved. As described above, since the sheet resistance Rs of the polycrystalline semiconductor is changed according to the arrangement of the doping ions, hereinafter the characteristic of the polycrystalline semiconductor that is changed is described through the sheet resistance value.

First, a comparative example of heat treatment referred to as is described. The comparative example executes the heat treatment in the temperature of 450° C. for a time of 60 minutes by using the furnace, and the sheet resistance value of the polycrystalline semiconductor is about 2039 Ω/sq. The sheet resistance value of the Ref shows a sheet resistance value of elements that may be conventionally used without any problem. Therefore, if the heat-treated polycrystalline semiconductor according to the present exemplary embodiment has the sheet resistance value similar to the conventional comparative example, the present exemplary embodiment may effectively substitute the conventional heat treatment using the furnace.

Accordingly, the experiment is executed by using the various temperatures and times according to the exemplary embodiments as shown in FIG. 9.

Referring to FIG. 9, compared with the comparative example using the furnace, the temperature for the heat treatment is lower and the time for the heat treatment is shorter, and most of the result of the sheet resistance (Rs) value is not significantly different from the comparative example. In the case of the heat treatment of 240° C. or 245° C., the sheet resistance value is relatively high which may exhibit some of the drawbacks. However, in other cases, the sheet resistance Rs is substantially similar to or even smaller than the comparative example. Accordingly, FIG. 9 shows that the heat treatment according to the exemplary embodiments may obtain substantially the same characteristic or even improved transistor characteristic.

Referring to FIG. 9, the sheet resistance value Rs may change depending on the temperature of the heat treatment rather than the time, and the polycrystalline semiconductor having the small sheet resistance Rs may be formed using the heat treatment processed at a temperature of over about 260° C. using the present exemplary embodiments. Here, 260° C. is calculated based on the sheet resistance Rs result of 245° C. and 265° C. in FIG. 9, and is a value considering an error range. FIG. 9 illustrates that the maximum experimental temperature of the heat treatment is 300° C., but the exemplary embodiments are not limited thereto, and the heat treatment may be possible at a higher temperature, for example, up to 350° C. degrees. Also, referring to FIG. 9, in the annealing apparatus according to the example embodiment, 8 to 10 minutes of heat treatment is sufficient for the heat treatment, thereby the heat treatment time may be shortened considerably compared with 60 minutes of the comparative example.

Also, compared to using the conventional furnace, the annealing equipment according to the present exemplary embodiment may achieve similar or better result using substantially reduced power consumption.

Referring to FIG. 9, the polycrystalline semiconductor heat treated using the annealing apparatus according to the exemplary embodiment has substantially the same or better sheet resistance compared to the conventional furnace heat processing, and the polycrystalline semiconductor may be sued in the display device.

Also referring back to FIG. 8, generation of the hillock in the metal material in the display device may be reduced, and the wiring material (aluminum (Al)) which could not be used in the furnace heat treatment, may be used for the wiring material. As a result, the wiring including aluminum may be used in the mother substrate to be received in the annealing apparatus according to the exemplary embodiments.

Accordingly, the annealing apparatus according to the exemplary embodiments may be appropriate for heat treating the mother substrate having relatively large size used to make display panels in the display device.

According to the exemplary embodiments, the annealing apparatus includes diffraction unit configured to diffract the microwaves introduced into the main body, such that the overall uniformity of the heat treatment applied by the microwave may be improved. Also, the annealing apparatus includes the diffusive reflection structure including the rough structure in the inner surface of the annealing apparatus, such that the uniformity of the heat treatment applied by the microwave may be further improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An annealing apparatus comprising:
a main body configured to receive a plurality of mother substrate for a display panel for a display device;
a microwave generating unit configured to generate microwaves to be transmitted to the main body;
an incidence unit configured to transmit the microwaves from the microwave generating unit to the main body; and
a diffraction unit disposed between the incidence unit and the main body, the diffraction unit configured to pass the microwaves therethrough before the microwaves are transmitted to the main body, wherein:
the diffraction unit comprises a plurality of slits to diffract the microwaves, wherein each of the plurality of slits has a rectangular shape having a width with a first length and a height with a second length smaller than the first length, the second length being slightly larger than a wavelength of the microwaves to generate a diffraction effect,
the incidence unit has a rectangular frustum shape and comprises an opening of which a width and height widens in a direction extending from the microwaves generating unit toward the diffraction unit,
the main body comprises a diffusive reflection structure formed on an inner surface of the main body, the diffusive reflection structure comprising protrusions and depressions, and
the microwave generating unit comprises a dual magnetron to generate a microwave having a wavelength of about 50 mm, and
wherein a pitch value of the protrusions and a depth value of the depressions are about 54 mm to about 66 mm.

2. The annealing apparatus of claim 1, wherein the diffraction unit's slit comprise the first length of the width is about 200 mm and the second length of the height is about 60 mm.

3. The annealing apparatus of claim 1, wherein the incidence unit comprises a first opening adjoining the microwave generating unit has a height of 270 mm or greater and 330 mm or less and a width of 405 mm or greater and 495 mm or less.

4. The annealing apparatus of claim 3, wherein the incidence unit comprises a second opening adjoining the diffraction unit has a height of about 450 mm to about 550 mm and a width of about 630 mm to about 770 mm.

5. The annealing apparatus of claim 1, wherein the diffusive reflection structure comprises silver (Ag) coated on an inner surface of the diffusive reflection structure.

6. The annealing apparatus of claim 1, wherein the main body and the incidence unit are formed of a stainless steel (SUS) material.

7. The annealing apparatus of claim 6, wherein the main body and the incidence unit comprise silver (Ag) coated on an inner surface of the SUS material.

8. The annealing apparatus of claim 6, wherein the diffraction unit is formed of the SUS material.

9. The annealing apparatus of claim 1, wherein the inner surface of the main body and an inner surface of the incidence unit comprise silver (Ag) coated on the inner surface of the main body and the inner surface of the incidence unit.

10. The annealing apparatus of claim 1, wherein the main body is configured to receive a plurality of substrates, and
wherein the substrate is a mother substrate for a display panel for a display device.

11. The annealing apparatus of claim 10,
wherein the annealing apparatus is configured to perform a heat treatment on the plurality of substrates by setting a predetermined temperature and a predetermined time of the heat treatment to prevent from forming hillocks on a surface of the plurality of substrates.

* * * * *